United States Patent
Ma et al.

(10) Patent No.: US 8,011,561 B2
(45) Date of Patent: Sep. 6, 2011

(54) METHOD OF MOUNTING ELECTRONIC COMPONENTS ON PRINTED CIRCUIT BOARDS

(75) Inventors: Ji Ma, Shenzhen (CN); Li-Bing Lu, Shenzhen (CN); Hui Luo, Shenzhen (CN); Qi Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 0 days.

(21) Appl. No.: 12/753,128

(22) Filed: Apr. 2, 2010

(65) Prior Publication Data
US 2011/0167627 A1    Jul. 14, 2011

(30) Foreign Application Priority Data
Jan. 13, 2010    (CN) .......................... 2010 1 0300241

(51) Int. Cl.
*B23K 31/02*    (2006.01)
(52) U.S. Cl. .................... 228/180.21; 228/225
(58) Field of Classification Search .......... None
See application file for complete search history.

(56) References Cited

U.S. PATENT DOCUMENTS

| | | | | | |
|---|---|---|---|---|---|
| 4,139,881 | A | * | 2/1979 | Shimizu et al. | 361/760 |
| 4,515,304 | A | * | 5/1985 | Berger | 228/136 |
| 4,761,881 | A | * | 8/1988 | Bora et al. | 29/840 |
| 4,982,376 | A | * | 1/1991 | Megens et al. | 361/760 |
| 5,070,604 | A | * | 12/1991 | Banba et al. | 29/837 |
| 5,144,535 | A | * | 9/1992 | Megens et al. | 361/760 |
| 5,155,904 | A | * | 10/1992 | Majd | 29/837 |
| 5,373,984 | A | * | 12/1994 | Wentworth | 228/180.1 |
| 5,598,967 | A | * | 2/1997 | Greenwood et al. | 228/174 |
| 5,678,304 | A | * | 10/1997 | Soper | 29/840 |
| 5,680,985 | A | * | 10/1997 | Wentworth | 228/246 |
| 5,785,233 | A | * | 7/1998 | Nutter et al. | 228/46 |
| 5,881,947 | A | * | 3/1999 | Gurewitz et al. | 228/180.21 |
| 5,993,500 | A | * | 11/1999 | Bailey et al. | 55/385.6 |
| 6,010,061 | A | * | 1/2000 | Howell | 228/180.21 |
| 6,095,403 | A | * | 8/2000 | Akin et al. | 228/180.1 |
| 6,807,730 | B2 | * | 10/2004 | Bo | 29/840 |
| 2003/0005581 | A1 | * | 1/2003 | Watanabe et al. | 29/739 |

* cited by examiner

*Primary Examiner* — Kiley Stoner
(74) *Attorney, Agent, or Firm* — Altis Law Group, Inc.

(57) ABSTRACT

A method of mounting electronic components on a PCB, includes following steps. The PCB is placed with a first side of the PCB facing upwards. A plurality of solder is applied on bonding pads of the first side. A plurality of electronic components is stuck on the bonding pads of the first side. The PCB is turned over with a second side of the PCB facing upwards and the first side of the PCB facing downwards. A plurality of solder is applied on bonding pads of the second side. A plurality of electronic components is stuck on the bonding pads of the second side. The PCB is placed in a reflow oven to weld the electronic components on the first side and the second side of the PCB.

11 Claims, 4 Drawing Sheets

METHOD OF MOUNTING ELECTRONIC COMPONENTS ON PRINTED CIRCUIT BOARDS

BACKGROUND

1. Technical Field

The present disclosure relates to methods of manufacturing printed circuit boards and particularly to, a method of mounting electronic components on a printed circuit board.

2. Description of Related Art

In Surface Mount Technology (SMT), different components, such as chips, transistors, capacitors, resistors, etc., are mounted on a printed circuit board (PCB) to form an electronic system board. Specifically, corresponding components connect to the PCB with solder deposited thereon. The PCB is then placed in a reflow oven for welding the components on the PCB via the solder. For most electronic system boards, electronic components are mounted on both sides of the PCB. The PCB is placed in the reflow oven to mount the electronic components on one side of the PCB, the PCB is then removed from the reflow oven, and reinserted into the reflow oven again to mount the components on the other side of the PCB. Thus, two steps are needed to solder the electronic components on the PCB, which is time-consuming.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
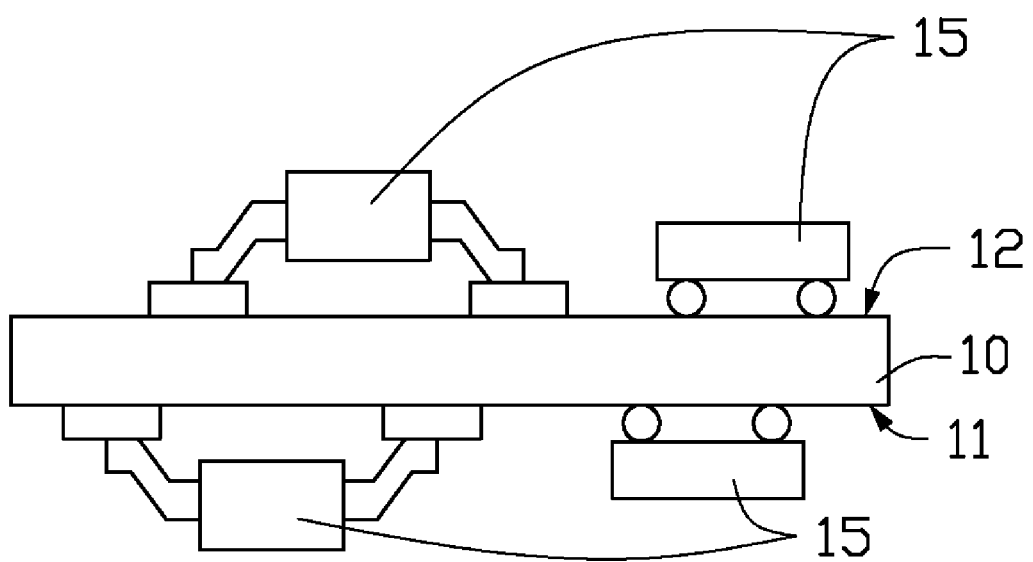
FIG. 1 is a sketch view of an electronic system board manufactured by a method of one embodiment of the present disclosure.

Referring to FIG. 1, an electronic system board manufactured by a method of one embodiment of the present disclosure includes a PCB 10, and a plurality of electronic components 15 mounted on the PCB 10. The PCB 10 has a first side 11 and a second side 12 opposite to the first side 11. The plurality of electronic components 15 are mounted on the first side 11 and second side 12 of the PCB 10. A number of the electronic components 15 mounted on the first side 11 is smaller than a number of the electronic components 15 mounted on the second side 12. Sizes of the electronic components 15 mounted on the first side 11 are smaller than sizes of the electronic components 15 mounted on the second side 12. Weights of the electronic components 15 mounted on the first side are lighter than electronic components 15 mounted on the second side 12.

Figure 2:
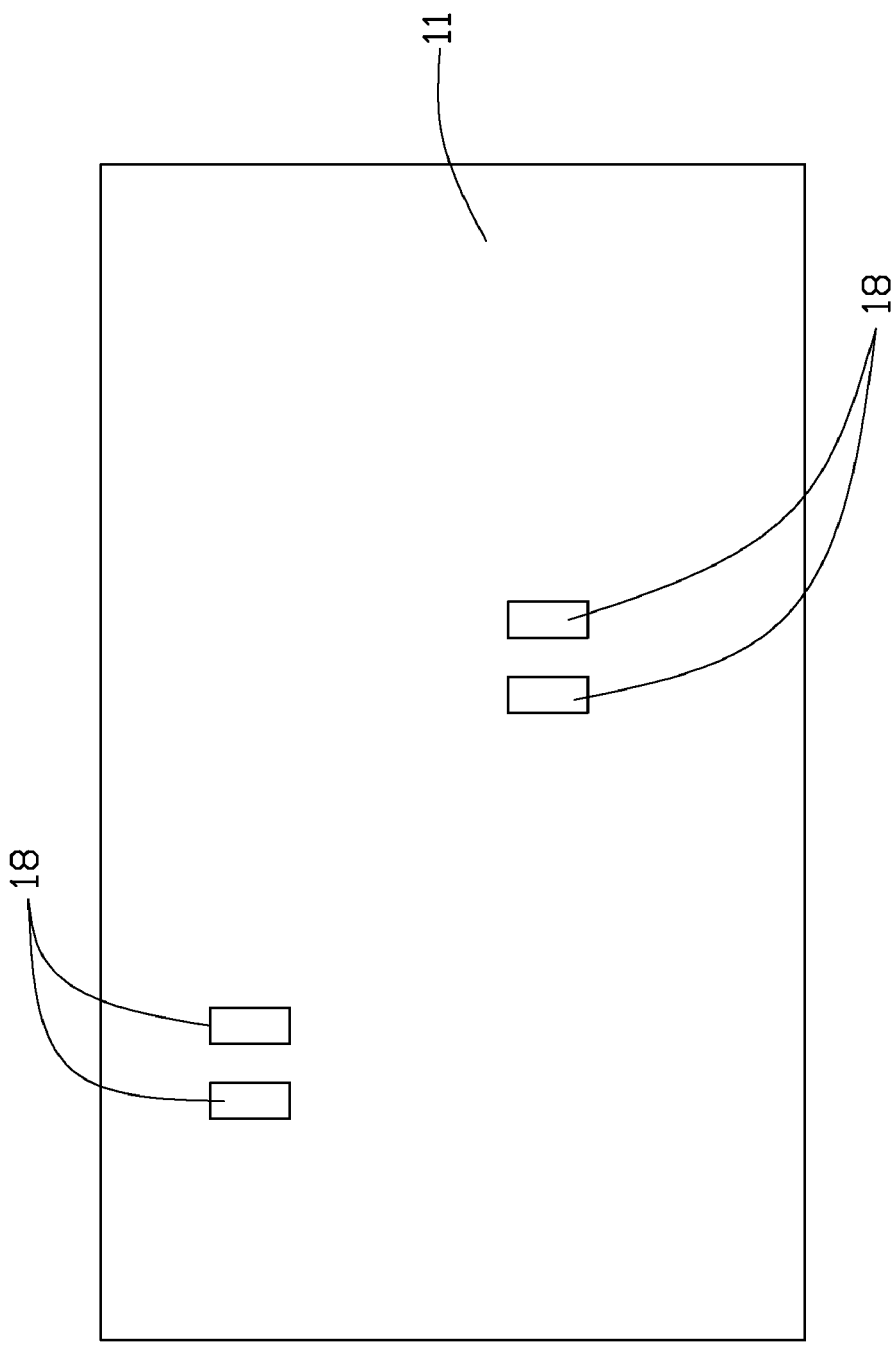
FIG. 2 is a sketch view of a first side of a PCB.

Referring to FIG. 2, a first side 11 of the PCB 10, is shown, with no electronic components 15 mounted. A plurality of bonding pads 18 are set on the first side 11. A shape of each of the bonding pads 18 is rectangular. Each of the bonding pads 18 has a large area, larger than that of bonding pads formed on the second side 12 of the PCB 10. Therefore, solder located on each of the bonding pads 18 are adequate to bond corresponding electronic components 15 thereon. Distance between each of the bonding pads 18 and edges of the PCB 10 are large enough to avoid the electronic components 15 being hit. For example, distances between each of the bonding pads 18 and the edges of the PCB 10 are larger than 15 millimeters.

Figure 3:
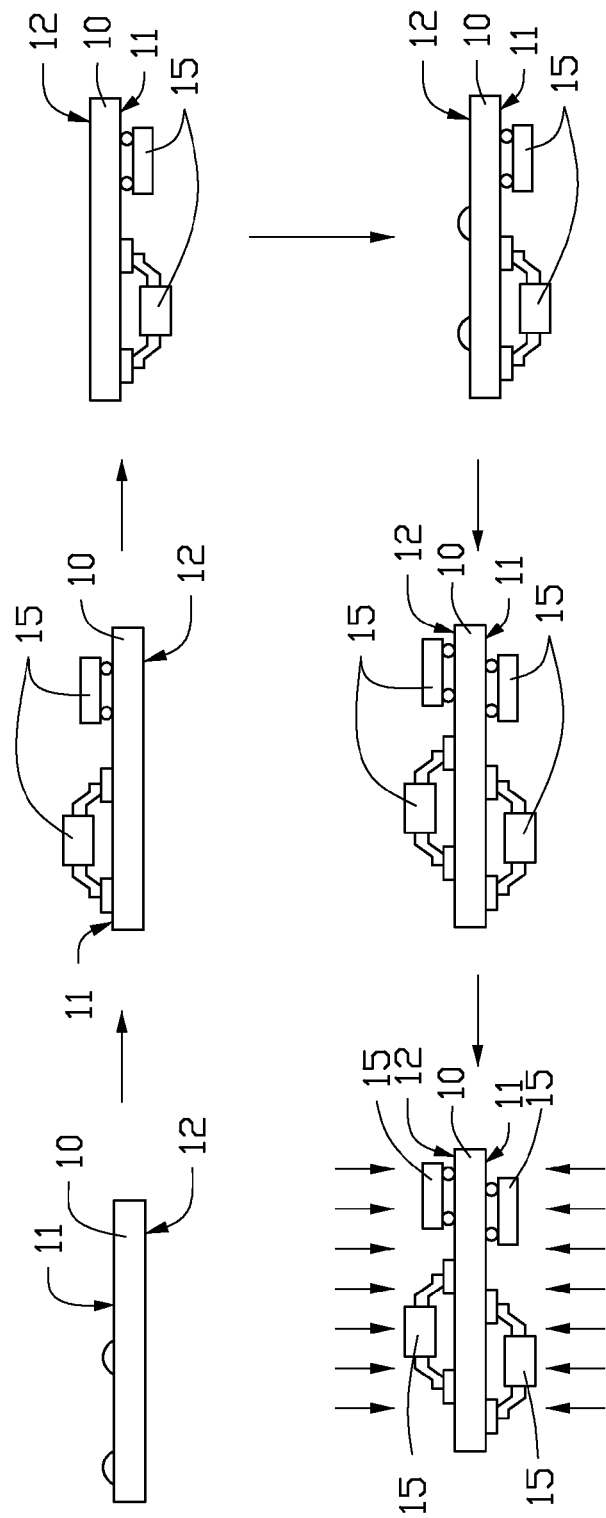
FIG. 3 is a sketch view of a processing flow of one embodiment of mounting electronic components on a PCB.
Figure 4:
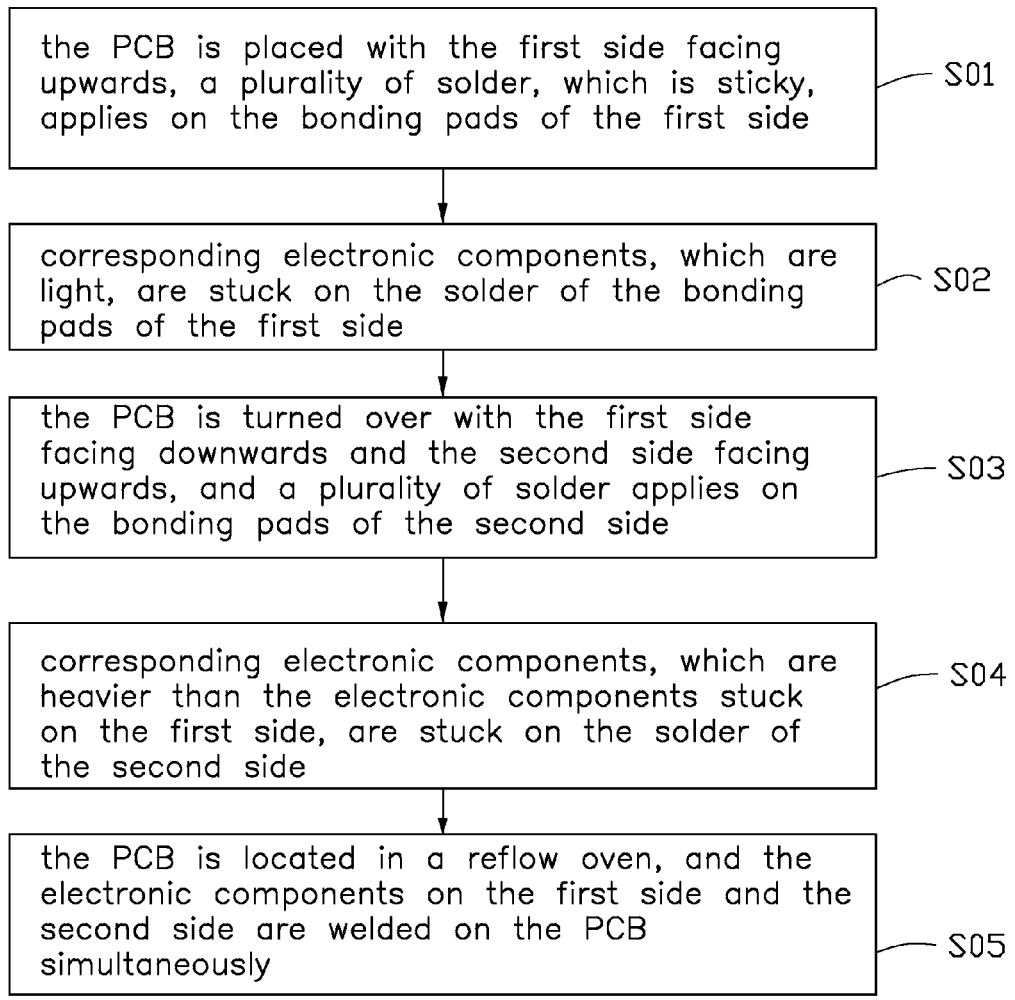
FIG. 4 is a flow chart of the method of FIG. 3.

Referring to FIGS. 3 and 4, a method of mounting electronic components 15 on the printed circuit board 10 is shown, as follows.

In step S01, the PCB 10 is placed with the first side 11 facing upwards. A plurality of solder, which is sticky are applied on the bonding pads 18 of the first side 11.

In step S02, corresponding electronic components 15, which are light, are stuck on the solder of the bonding pads 18 of the first side 11.

In step S03, the PCB 10 is turned over with the first side 11 facing downwards and the second side 12 facing upwards. Because the solder on the first side 11 have certain stickiness, and the electronic components 15 stuck on the first side 11 are light, the electronic components 15 of the first side 11 do not fall off the first side 11. Then, a plurality of solder are applied on the bonding pads of the second side 12.

In step S04, corresponding electronic components 15, which are heavier than the electronic components stuck on the first side, are stuck on the solder of the second side 12.

In step S05, the PCB 10 is placed in a reflow oven. The electronic components 15 on the first side 11 and the second side 12 are welded on the PCB 10 simultaneously.

In the above embodiment, the electronic components 15 are welded on the first side 11 and the second side 12 in one step. The manufacturing procedure of the above embodiment is simple and timesaving in contrast to the conventional method.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

It is also to be understood that the above description and the claims drawn to a method may include some indication in reference to certain steps. However, the indication used is only to be viewed for identification purposes and not as a suggestion as to an order for the steps.

What is claimed is:

1. A method of mounting electronic components on a PCB, comprising:

placing a PCB with a first side of the PCB facing upwards, and applying a plurality of solder on bonding pads of the first side;

sticking corresponding electronic components on the bonding pads of the first side;

turning the PCB with a second side of the PCB facing upwards and the first side of the PCB facing downwards, and applying a plurality of solder on bonding pads of the second side, wherein an area of each of the bonding pads of the first side is larger than an area of each of the bonding pads of the second side;

sticking corresponding electronic components on the bonding pads of the second side; and placing the PCB in a reflow oven to solder the electronic components on the first side and the second side of the PCB.

2. The method of claim 1, wherein a number of the electronic components mounted on the first side is smaller than a number of the electronic components mounted on the second side.

3. The method of claim 2, wherein weights of the electronic components mounted on the first side are lighter than weights of the electronic components mounted on the second side.

4. The method of claim 3, wherein a stickiness of the solder applied on the bonding pads of the first side are capable of preventing the electronic components falling off the first side when the first side is facing downwards.

5. The method of claim 1, wherein the shapes of the bonding pads of the first side are rectangular.

6. The method of claim 1, wherein distances between the bonding pads of the first side and edges of the PCB are larger than 15 millimeters.

7. A method of mounting electronic components on a PCB, comprising:

providing a PCB with a first side of the PCB facing upwards, a plurality of first bonding pads formed on the first side of the PCB;

applying a plurality of solder on the first bonding pads, and sticking a plurality of first electronic components on the first bonding pads by the solder;

turning the PCB with a second side of the PCB facing upwards and the first side of the PCB facing downwards, a plurality of second bonding pads formed on the second side of the PCB, wherein an area of each of the first bonding pads is larger than an area of each of the second bonding pads, a stickiness of the solder applied on the first bonding pads of the first side are capable of preventing the first electronic components falling off the first side when the first side is facing downwards;

applying a plurality of solder on the second bonding pads of the second side, and sticking a plurality of second electronic components, which are heavier than the first electronic components, on the second bonding pads; and welding the first and second electronic components on the first and second bonding pads simultaneously.

8. The method of claim 7, wherein a number of the first electronic components mounted on the first side is smaller than a number of the second electronic components mounted on the second side.

9. The method of claim 7, wherein weights of the first electronic components are lighter than weights of the second electronic components.

10. The method of claim 7, wherein the shapes of the first bonding pads are rectangular.

11. The method of claim 7, wherein distances between the first bonding pads of the first side and edges of the PCB are larger than 15 millimeters.

* * * * *